(12) United States Patent
Vicente et al.

(10) Patent No.: US 7,066,261 B2
(45) Date of Patent: Jun. 27, 2006

(54) PERFORATING SYSTEM AND METHOD

(75) Inventors: José German Vicente, Houston, TX (US); Gregory Scott Yarbro, Casper, WY (US)

(73) Assignee: Halliburton Energy Services, Inc., Houston, TX (US)

( * ) Notice: Subject to any disclaimer, the term of this patent is extended or adjusted under 35 U.S.C. 154(b) by 184 days.

(21) Appl. No.: 10/753,667

(22) Filed: Jan. 8, 2004

(65) Prior Publication Data

US 2005/0150687 A1    Jul. 14, 2005

(51) Int. Cl.
  *E21B 29/02* (2006.01)
(52) U.S. Cl. .................. 166/298; 166/55.2; 166/65.1
(58) Field of Classification Search .................. None
  See application file for complete search history.

(56) References Cited

U.S. PATENT DOCUMENTS 4,007,796 A * 2/1977 Boop .................. 175/4.55
4,208,966 A    6/1980 Hart
4,234,767 A   11/1980 Davis et al.
4,454,841 A    6/1984 Reinhard et al.
4,457,383 A    7/1984 Boop
4,496,010 A    1/1985 Chapman
4,527,636 A    7/1985 Bordon
4,778,009 A   10/1988 Sumner et al.
4,991,684 A    2/1991 Mitchell
5,521,164 A    5/1996 della Valle et al.
5,531,164 A    7/1996 Mosley
5,700,969 A   12/1997 Mosley

FOREIGN PATENT DOCUMENTS

WO    WO 90/12332    11/1990

* cited by examiner

*Primary Examiner*—Zakiya W. Bates
(74) *Attorney, Agent, or Firm*—Browning Bushman P.C.

(57) ABSTRACT

A system for perforating a well includes a plurality of perforating guns suspended in the well from the wireline or coiled tubing. A downhole electronic command circuit is provided for firing each of the guns in response to a command signal from the surface. A conductor cable, which may be the wireline, extends from the surface to the downhole command circuit, such that command signals fire the guns in a selected order.

20 Claims, 2 Drawing Sheets

PERFORATING SYSTEM AND METHOD

FIELD OF THE INVENTION

The present invention relates to perforating systems and methods for perforating an oil or gas well, with the system including a plurality of perforating guns suspended in the well by either a wireline or coiled tubing.

BACKGROUND OF THE INVENTION

After drilling an oil or gas well, a metal casing is conventionally cemented to isolate the producing zones. The wall of this casing may be perforated at zones where the entry of oil or gas from the surrounding formation is desired. This activity may be referred to as jet perforation. Charges may be detonated by making electric current pass through an electrical initiator, also known as a detonator, igniter or blasting cap.

A number of charges may be assembled inside a steel hollow carrier. Sometimes a zone uses a number of perforations along a predetermined length, defining a perforating density which uses a selected number of charges inside a hollow carrier of a known length. For lower cost and rig time, it is desirable to perforate several different production zones using one wireline trip into the hole, rather than make one trip for each perforating operation.

Dual or tandem selective guns have long been used which perforate two different zones by using diodes. By applying a positive voltage, the bottom section may be detonated, and then the top section on next zone detonated applying a negative voltage.

Conventional prior art methods involve the use of alternating polarity, i.e., one section is fired by a positive voltage, the next section will require a negative voltage, and so on. The condition to keep the sequence going requires that the next upper section gets a complete explosive detonation, meaning that the electric initiator and the intended charge or group of charges in the lower section must successfully go off. A mechanical switch may be used to electrically connect one of the leads of the electrical initiator, usually the ground cable, for the next section to be fired, thereby requiring mechanical energy coming from the explosion of the charges.

Rather than use the mechanical force of a detonating wave to activate the switch for firing the next gun, some systems utilize a motorized switch with mechanical contacts. Motorized switches have high maintenance costs and complicated operational procedures, and frequently have a high failure rate due to mechanical nature of operation. Selector switches have also been devised that utilize digital codes to select the desired gun to be fired. Selector switches that utilize digital codes require special fire control panels.

Systems which rely upon mechanical switching techniques have inherent disadvantages. The shock wave from a large gun may be sufficient to disable any mechanical switching system. Accordingly, mechanical switching systems have generally been limited to applications with guns with relatively small charges. Other systems involve multiple lines for detonation of multiple guns, but these multiple conductor lines add appreciable costs.

U.S. Pat. Nos. 5,531,164 and 5,700,969 disclose systems which control a selected firing detonation. A switch may be activated by a shock wave acting on a dart which provides an electrical path to ground. The ground path then results in altering the state of the switch, i.e., a path to ground or a path isolated from ground. These patents rely upon the repercussion shock of one charge to respectively "cock" the system for firing the next gun. Since it is not uncommon for one of the guns not to fire (which may occur in from 5 to 10% of the cases), misfiring of one gun requires that the entire string be pulled. Also, a gun may fire so strongly that the cable, which is typically pressed into engagement with ground, may be cut so that the signal is lost, and again the string must be returned to the surface.

Other systems for activating a perforating guns are disclosed in U.S. Pat. Nos. 4,208,966, 4,234,767, 4,454,814, 4,457,383, 4,496,010, 4,991,684, 4,527,636, 4,778,009, 5,521,164, and 5,700,969. PCT/US90/01842 discloses a geophysical exploration system using large explosive charges.

The disadvantages of the prior art are overcome by the present invention, and an improved perforated system and method are hereinafter disclosed. The invention may also be used to selectively fire a downhole sampling tool.

SUMMARY OF THE INVENTION

The perforating system of the present invention may both improve efficiency and reduce failure when compared to prior art systems. The present invention avoids mechanical switching devices, and does not rely upon a shock wave to reactivate to next gun for firing. The system of this invention instead provides the ability of producing a desired switching sequence independent of the detonation of a proceeding section.

The system may produce a detonation independent sequence when blowing (opening) fuses within the downhole command circuit. A preferred embodiment may be based on a single expendable unit placed within the uppermost gun.

It is an object of the present invention to provide an improved system for perforating different or multiple production zones, with the perforating system perforating two or more zones from a single wireline.

In a preferred embodiment, the perforating system for perforating a well includes a plurality of perforating guns suspended in a well from a wireline or coiled tubing. The perforating system includes a downhole electronic control circuit or command circuit for firing each of the plurality of guns in response to a command signal transmitted through a single conductor, which may or may not be the electric line which suspends the gun assembly in the well. The command circuit and command signal together control the firing of the guns in the selected sequence, conventionally from the bottom gun upward.

The command circuit is preferably controlled by a command signal from the surface to the downhole command circuit. The downhole command circuit preferably is an integrated circuit board which has memory with or without electrical power. In a preferred embodiment, a selected fuse within the command circuit is burned to provide for firing the next of the plurality of guns in the selected order.

In a preferred embodiment, the command signals from the surface to the downhole command circuit is one of a positive DC charge and a negative DC charge, and can be applied in an alternating or non-alternating sequence.

Another application within the oil and gas production industry which involves the selected activation of downhole tools is sequential shooting of a metallic barrel to take a sample of the desired formation to be analyzed once it is returned to the surface. A concept similar to the activation of gun may be used to fire one barrel at a time to take test samples.

These and further features and advantages of the present invention will become apparent from the following detailed description, wherein reference is made to figures in the accompanying drawings.

DETAILED DESCRIPTION OF PREFERRED EMBODIMENTS

Figure 1:
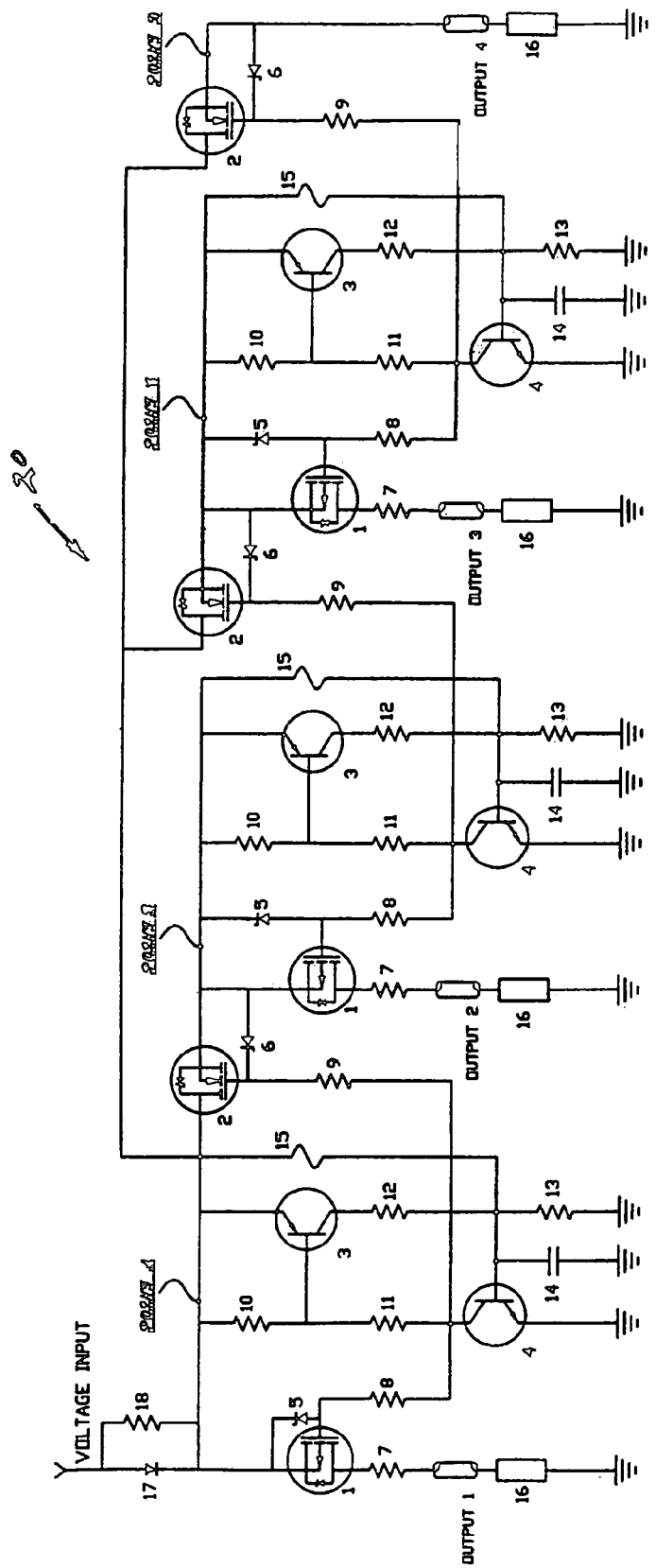
FIG. 1 illustrates one combination of a command circuit according to the present invention for selectively controlling the firing of a gun assembly, with a command circuit preferably positioned within the uppermost gun section.

The following text and FIG. 1 discuss embodiments which use a positive DC electrical transmission system from the surface to the downhole command circuit. Those skilled in the art will appreciate that a negative and/or a positive and negative DC system could alternatively be used to transmit the command signals to the downhole circuit. A DC system allows a single conductor with an increasing current to open a fusible link, as discussed below. The fusible link may be an electrical fuse, a low wattage resistor, or other suitable device which opens or is opened (blown). Each of these devices is considered a "fuse" as that term is used herein. A conventional conductor cable, which may be the wireline, may be used for conducting DC signals from the surface to the command circuit. The DC charge could be applied in an alternating sequence, although preferably the DC charge is non-alternating.

In one embodiment, the system produces a sequence which allows for a switching unit or command circuit to be reused by replacing the expendable components. Based on low cost and higher reliability, a preferred embodiment may thus be an expendable unit, which may be located inside the last section in sequence, which is preferably the uppermost gun assembly.

Each gun section may be assembled to another gun section by threaded connections using a double pin adapter sub or a tandem sub. Each tandem sub may have also a cavity to hold a metal dart. This dart may be used to provide hydraulic isolation to the portion of the gun assembly which is immediately above the detonated section. When a section is detonated, the high pressure impact may push the dart against the cavity and plug the hole. Another embodiment of the assembly uses an additional cavity and dart placed at the top of the tandem sub so that, in the event of a section failure, continuing the sequence will not spoil the failed section.

The switching unit or command circuit may be placed inside the top gun section, and the input cable directly wired to the wireline or logging cable through the top sub or adapter of the tool. A casing collar locator or GR perforator tool may be used. The unit may have as many outputs as gun sections in the assembly. Each cable may follow down and its end be wired to the live cable of the detonator inside its corresponding section. Detonators may be placed at the bottom of the section. The other cable from the detonator may be conventionally wired to ground.

The switching unit or command circuit may also be assembled as an array of basic stages of electronic components with a well defined function. Each basic stage directs the current path whenever a positive voltage is applied on the line. There are as many similar stages as sections to be shot minus one, since the last section in the sequence does not require such function.

The function of the basic stage may be: 1) to provide a controlled electrical path to the detonator, 2) to provide a controlled electrical path to the next section, and 3) to latch and thereby keep the section enabled along the entire firing sequence of the section involved until the power is turned off.

The command circuit may be configured to operate either using a negative or a positive voltage sequence of power applied from the surface through the conductor cable. Positive voltage means that the potential at the line will be higher than the common reference or ground, and electrically attached to the cable armor of the wireline or line. Negative voltage applies to the line a lower potential than ground. Positive voltage may be accomplished when the positive lead of any direct current power supply is attached to the line and the negative to the ground.

FIG. 1 shows one example of the command circuit for a positive voltage switch with four sections, as an example, and the group of electronic components forming the defined basic stage. The functions of the basic stage may be identified by the corresponding subgroup components as follows:

1) The controlled path to the detonator is performed by the P-channel field effect transistor (MOSFET) 1 and its relating biasing components, resistor 8 and zener diode 5 which protects the gate limiting the Vgs (voltage from gate to source) below its maximum permissible value. Resistor 7 is a short circuit protection.
2) The controlled path to the following sections is performed by the N-channel field effect transistor (MOSFET) 2 and it associated biasing components, resistor 9 and the Vgs protection zener diode 6.
3) The latch capability is performed by the two bipolar transistors 3 and 4 and its biasing components resistors 10, 11, 12 and 13; capacitor 14 to prevent turning on due to high dV/dt. The fuse 15 is the trigger of the latch. It is the status of this latch (ON or OFF) that controls the switching MOSFETs. Whenever the latch is on the ON state, that particular stage will provide all the current for the detonator and will block the flow to the following sections. On the other case, when in the OFF stage, the MOSFET 1 will be in the cut-off mode and MOSFET 2 in conduction mode giving a direct current path for the next stage.

During jet perforating operations, voltage may be applied to the logging cable (or line) in an slowly and increasing way in function of time until current or mechanical indication that the gun assembly already went off is perceived. The power may then be switched off until the gun assembly is placed over the next perforating zone.

Referring still to FIG. 1, point A is directly attached to the logging cable thru diode 17, thus when voltage applied to the line start to increase from zero, point A will increase accordingly. Fuse 15 provides a direct path to the base of BJT 4 assuring this transistor will keep on the ON state meanwhile voltage at point A continues increasing. If BJT 4 is in the ON state, gate voltage on MOSFET 1 is following the drain voltage Vgs~Vds, which means MOSFET 1 is kept to start on the ON state too. As voltage at point A keeps increasing, once the gate threshold voltage is reached, Vgs>Vth, MOSFET 1 will start to pass current. This threshold voltage is a characteristic of a particular MOSFET and is typically between 2 and 4 volts. Meanwhile, the gate voltage of the N Channel MOSFET 2 is being kept at the same potential of the source which means the effective Vgs voltage is close to zero keeping the MOSFET 2 in the cut-off state blocking the current to flow to the following stages.

In order to produce the sequence, fuse 15 may be blown (opened) at some point before the power goes back to zero upon firing of the detonator. Fuse 15 should be opened before enough current to set off the detonator is applied. The resistorized detonators may be designed to go off at some value between 0.25 to 0.8 amperes. A preferred embodiment for fuse 15 is to use a 1/32 Ampere fuse, which means it will go off with approximately 45 mA. This fuse will go off when approximately 6 volts are applied across its terminals, which means approximately 7 volts must be present at point A. Transistors 3 and 4 will remain latched after the fuse is opened. As line voltage (point A) continues increasing, the MOSFET 1 continues in the ON state with its dynamical channel resistance going even low. From now on, how much voltage is needed to shoot will depend on the resistance of the particular detonator used (could be 55 to 120 Ohms) plus the short circuit protection resistor 7 which is conventionally from 10 Ohms. Assuming a 120 Ohms resistorized detonator, the firing voltage will be between 33 to 105V. The function of the short circuit protection resistor 7 is to avoid the voltage on point A going below a value that could turn off the latch. The values of resistors 10, 11, 12 and 13 are designed in order to satisfy both conditions: a) the latch cannot be turned on if its fuse is open before applying voltage and b) the transistors 3 and 4 must remain latched at the lowest voltage level possible on point A. This value is about 2.5 volts.

The following example shows how the resistor 7 prevents the latch to turn off. Assume a worst case condition of highest resistance wireline, with highest resistance detonator and going off with the maximum current of 0.8 amperes. Current will flow thru a 220 Ohms (line) and a 130 Ohms (resistor 7 plus detonator 16). The surface voltage needed for this condition has to be 280 V. If immediately after firing, the cable going to the detonator gets shorted to ground, the voltage at point A will drop to approximately 12V. This value is well above the minimum voltage at which the latch circuit would turn off (2.5 volts). The remaining stages may be understood by the above explanation. All other stages can be analyzed as per the above explanation by replacing point A with points B, C or D, accordingly.

In stage 1, the detonator's current passes through MOSFET 1 only, on all the other stages, the detonator's current flows through MOSFET 1 of the particular stage and also thru MOSFET 2 of the preceding section. The last section does not need a latch circuit nor the short circuit protection, since its detonator is directly connected to the source of the MOSFET 2 of the preceding section.

The detonator for each section may have the first terminal connected to the wire from the unit according to its position in the firing sequence. The second terminal of the detonator may be connected directly to ground. The configuration may be similar for the other detonators of other sections. The unit may be assembled to work using a sequence of either positive and/or negative voltage. A positive voltage unit is disclosed, but a negative voltage unit or alternatively responsive units may be used. The total number of sections that may be shot in a select firing manner is thus not limited. For example, four separated explosive sections may be sequentially detonated, as shown in FIG. 1.

The electronic circuit may be comprised of an array of similar stages. There may be as many stages as sections intended to detonate in a selected firing sequence with the exception of the last section, which does not require the same arrangement of electronic components. Each stage may provide dual complementary switching with a latching capability. A latched pair of bipolar transistors may keep the status of the particular stage by providing a low resistance path from the line to the detonator while blocking the current from passing to the other sections.

The diode 17 and resistor 18 are an optional feature if a protection against accidental negative voltage applied to this positive selector is desired. Diode 17 will block any negative D.C. current applied to the line. Resistor 18 is a high resistance value and its purpose is to allow continuity checks normally performed during the assembly process to verify that connections are good.

In a preferred embodiment, the selector or command circuit 20 may be placed inside the uppermost gun section. The gun assembly may thus include two or more axially spaced gun sections, with the uppermost gun section preferably supporting the command circuit. The lowermost gun is conventionally fired first, and that gun may either disintegrate or be released from the assembly, then the gun assembly repositioned and the next lower gun fired, etc., until all the guns are fired.

The electronic components including the command circuit 20 shown in FIG. 1 may be encapsulated using an epoxy or a synthetic rubber resin. Inputs and outputs may be made using screw terminals or cables coming from the inside of the encapsulation. A suitable commercial unit may include commercial semiconductors rated at up to 150° C. Encapsulation for mechanical robustness should also be considered. In another embodiment, the command circuit 20 may be mounted within a separate housing, so that it is protected from the shock of all the guns, including the uppermost gun, and may be retrieved with the wireline or coiled tubing.

Larger diameter cable ends at the input of the control unit within the command circuit 20 may have as many outputs as different guns to accomplish the intended sequence. Each output may be wired directly to one of the leads of an electric indicator, also referred to as a detonator or igniter. The other lead from the electric indicator may be wired to ground, which may be connected to the cable armor.

As noted above, the system of the present invention may use power MOSFET's as the electronic switching device. A single command circuit may be placed just above the uppermost gun in the system. In a preferred reliably simple system, the command signal uses the application of the same polarity DC voltage, not polarity alteration.

Figure 2:
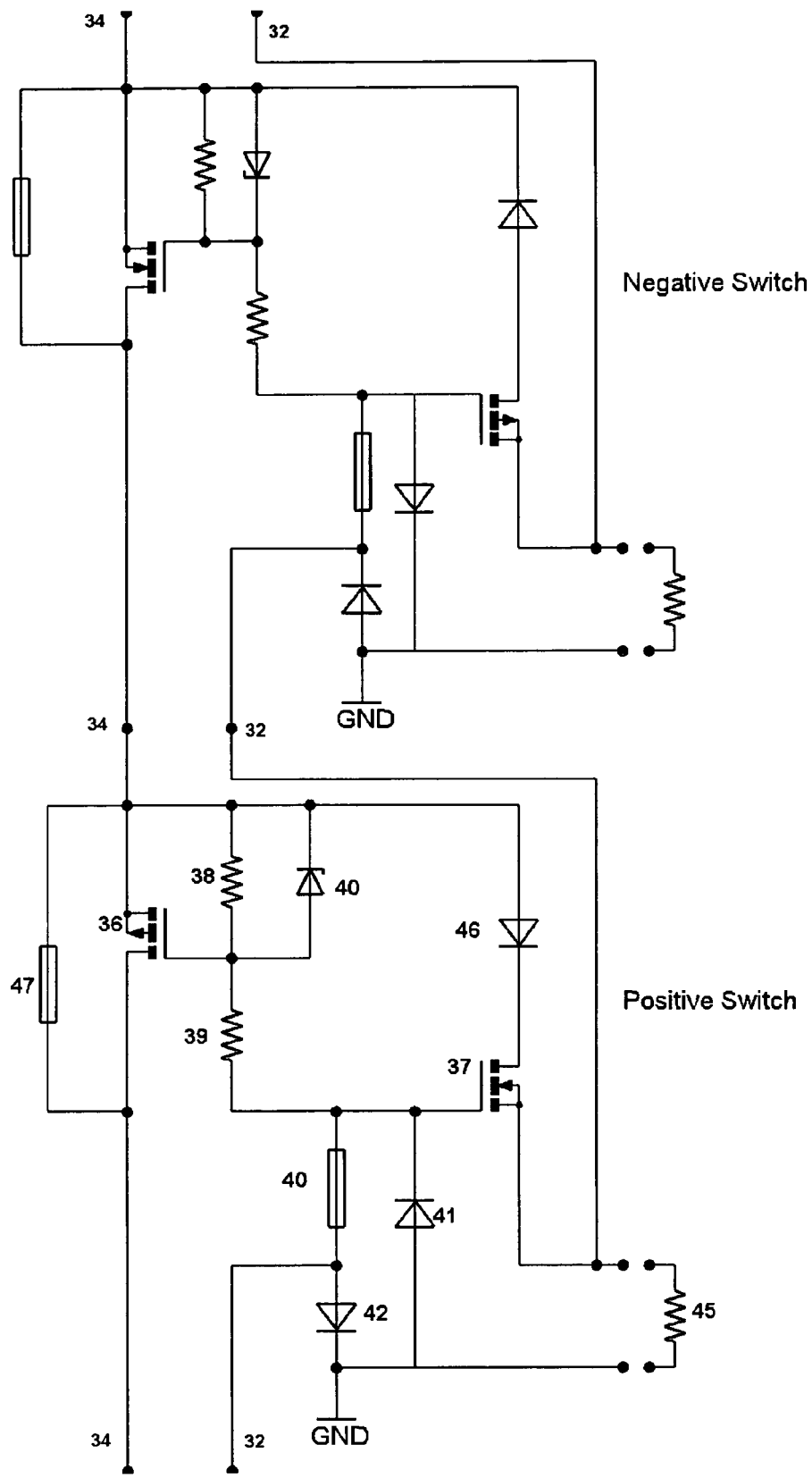
FIG. 2 illustrates another embodiment of a command circuit according to the present invention for selectively controlling the firing of a gun assembly, with the command circuit assembled in each gun section.

FIG. 2 discloses an alternative command circuit 30 for activating each detonator. Two wires may be run to each perforating gun. The feed through wire 32 may be used to provide detonating current through the system to the desired detonator. A second wire 34 may be used to control the state of the switch. The number of switches is limited by the voltage drop of each switch and the power capacities of the electrical source. Each switch may be designated as either a "positive fire" or a "negative fire" switch, based on the plurality required to initiate the detonator.

Gun detonation may be achieved by applying a selective polarity of DC voltage. Switch polarity may be alternated during assembly of the gun system, so that each gun is detonated in order. The lowest gun is normally detonated first, then detonation proceeds upwards to the next gun, and continues until all the guns are fired.

Control of the state of each switch may be achieved by passing a current through the control line from one switch to the next. When the lowest gun is detonated, some of the detonating current is directed to the control line. This current opens a fusible link, thus changing the reference voltage of one or more switching elements. The fusible link may be an electrical fuse, a low wattage resistor, or other suitable device which opens or is opened (blown). Each of these devices is considered a "fuse" as that term is used herein. Switching elements are solid state switching devices, such as MOSFET transistors or insulated gate bi-polar transistors.

The operation of the command circuit may be understood by considering the Positive Switch shown in FIG. 2. In order for the switch mechanism to be initiated, the lowest switch may have the feed through wire 34 tied in common to the control line 32. They may either be attached to the lowest detonator or used as a means of "arming" the first gun.

The parallel fuse 47 is provided as a means of verifying circuit integrity at the time of assembly. With the detonation of the first gun, the applied current exceeds the value of all of the parallel fuses, effectively removing them from the circuit.

The switch may operate first in a "pass through mode", allowing both positive and negative current to pass through the Mosfet 36 and down the feed through line 34, while preventing either voltage polarity from reaching and initiating the detonator 45. For the positive switch, the integral zener diode built into the Mosfet 36 will allow negative voltages to continue down the feed through line 34. Negative voltages are prevented from reaching the detonator 45 via the integral zener diode in Mosfet 37 by the diode 46.

Positive voltages are allowed to pass through the switch by turning on the Mosfet 36. This is achieved by raising the Gate to Source voltage level (VGS) above the required threshold. The two resistors 38, 39 act like a voltage divider. Current flows through these series resistors, through the fuse 40 and diode 42 to ground. Resistance values may be selected for the resistors to prevent exceeding the current limit of the fuse 40. The zener diode 40 prevents exceeding the VGS rating of the Mosfet 36. In the pass through mode, current is prevented from reaching the detonator 45 as the Mosfet 37 is turned off as its gate is tied to ground and therefore VGS=0.

The switch state is changed by passing a negative voltage through a lower detonator. The negative current flows through the feed through line 34 and back up the control line 32, through the fuse 40 and then through the diode 41 to ground. As the fire voltage is increased, more current flows through the fuse 40 until it's limit is exceeded, thus opening the above described circuit. Power is further increased until the lower detonator is fired. Now that the switch is activated, it will allow the detonator 45 to be initiated with a positive current while preventing positive current to continue below the switch and possible short out the circuit.

With the fuse 40 opened, no current can flow through resistor 38, thus the VGS for Mosfet 36 remains at zero for positive voltages. This keeps the Mosfet 36 turned off and prevents positive current from flowing through the switch. Likewise, with the fuse 40 open, the gate of Mosfet 37 is no longer tied to ground and rises with the drain voltage. Thus the Mosfet 37 is turned on and positive current is allowed to flow through the Mosfet and into the detonator 45. Likewise, a portion of this current flows up the control line 32 and into the fuse of the next switch, repeating the cycle.

The state of the switch performs two functions. In the pass through mode, the current is allowed to pass through the feed-through wire to a lower switch latch detonator combination. This also prevents current from flowing through its detonator. In the armed mode, current is prevented from passing through the switch, but is directed to its detonator. The direction of current flow in the control line may either be from an upper switch to a lower switch, or from a lower switch to an upper switch, depending on the circuit construction.

In the above embodiment, the switch may be controlled by a current flowing through the control line from the lower switch to the upper switch at the time of detonation. P and N channel MOSFETS are used.

In an alternate embodiment, the switch may be controlled by a current flowing through the control line from the upper switch to the lower switch at the time of detonation. In yet another embodiment, the switch may be controlled by a current flowing through the control line from the lower switch to the upper switch at the time of detonation, utilizing all N channel MOSFETS.

The term "fuse" is used herein in a broad sense to refer to any device which opens an otherwise closed line in the command circuit to control the firing order of the plurality of guns or the activation order of a plurality of downhole tools. A protective housing may be used to protect the command circuit from the force of the firing gun and, most particularly, the uppermost gun, which is typically immediately below the command circuit. A protective housing provides protection from the shock of the firing guns so that the command circuit may be retrieved after the uppermost gun has been fired. The command circuit may be inspected and the protective housing and the command circuit re-used on another gun assembly.

A suitable swivel may be used above the perforating guns for selectively orienting one or more of the plurality of guns prior to firing. Various types of swivels may be used for this purpose, including a swivel with a unidirectional ratchet assembly, as disclosed in U.S. application Ser. No. 10/371,254 filed Feb. 20, 2003.

The system of the present invention may also be used to selectively activate jet perforations systems and core gun samplers. The command circuit may be used to sequentially shoot metallic barrels of a formation test sampling device. Other downhole devices for selectively activatable according to the present invention include mono-cable explosive devices that fire two or more devices.

While preferred embodiments of the present invention have been illustrated in detail, it is apparent that other modifications and adaptations of the preferred embodiments will occur to those skilled in the art. The embodiments shown and described are thus exemplary, and various other modifications to the preferred embodiments may be made which are within the spirit of the invention. Accordingly, it is to be expressly understood that such modifications and adaptations are within the scope of the present invention, which is defined in the following claims.

The invention claimed is:

1. A perforating system for perforating a well, the perforating system including a plurality of perforating guns suspended in the well from one of a wireline and coiled tubing, the perforating system further comprising:
   a downhole electronic command circuit for firing each of the plurality of guns in response to a respective command signal, the command circuit controlling the firing of the guns;
   a conductor cable, which may be the wireline, extending from the surface to the downhole command circuit for firing the guns in a selected order; and
   the command circuit including a fuse opening in response to the command signal when firing a gun and activating a switch for subseguently firing another gun.

2. A perforating system as defined in claim 1, wherein the command signals from the surface to the downhole command circuit is one of a positive DC charge and a negative DC charge.

3. A perforating system as defined in claim 1, wherein the command circuit is a solid state circuit.

4. A perforating system is defined in claim 1, wherein the command circuit is supported on an uppermost of the plurality of guns.

5. A perforating system as defined in claim 1, wherein the command circuit is retrieved to the surface after the guns are fired.

6. A perforating system as defined in claim 1, wherein a feed-through wire from the command circuit to each gun provides a detonating current to fire the gun, and a control wire controls the state of a solid state switch within the command circuit.

7. A perforating system as defined in claim 1, wherein opening of the fuse changes a reference voltage in one or more switching elements.

8. A system for selectively activating a plurality of tools suspended in a well, the system comprising:
- a downhole electronic command circuit for firing each of the plurality of tools in response to a respective command signal, the command circuit including a fuse opened in response to the command signal to fire one of the plurality of tools and activating a switch for subsequently firing another of the plurality of tools; and
- a conductor cable extending from the surface to the downhole command circuit for firing the tools in the selected order.

9. A system as defined in claim 8, wherein the command circuit is retrieved to the surface after the tools are activated.

10. A system as defined in claim 8, wherein the command circuit is a solid state circuit.

11. A system as defined in claim 8, wherein the command signal from the surface to the downhole command circuit is one of a positive DC charge and a negative DC charge.

12. A system as defined in claim 8, wherein a feed-through wire from the command circuit to each tool provides a detonating current to activate the tool, and a control wire controls the state of a solid state switch within the command circuit.

13. A system as defined in claim 8, wherein opening of the fuse switches a reference voltage in one or more switching elements.

14. A method of activating a plurality of tools suspended in the well from one of a wireline and coiled tubing, the method comprising:
- providing a downhole electronic command circuit to activate each of the plurality of tools in response to a respective command signal, the command circuit controlling the activation of the tools in response to opening a fuse in the command circuit in response to the command signal when firing one of the plurality of tools and activating a switch for subsequently firing another of the plurality of tools; and
- transmitting the command signal between the surface and the downhole command circuit to activate the tools in a selected order.

15. A method as defined in claim 14, wherein the command signals between the surface to the downhole command circuit are one of a positive DC charge and a negative DC charge.

16. A method as defined in claim 14, further comprising:
- selectively orienting one or more of the plurality of tools within the well with a swivel.

17. A method as defined in claim 14, wherein the command circuit is retrieved to the surface after the tools are activated.

18. A method as defined in claim 14, wherein the command circuit is a solid state circuit.

19. A method as defined in claim 14, wherein the command signals are non-alternating.

20. A method as defined in claim 14, wherein the command circuit is positioned in the well on an uppermost of a plurality of tools.

* * * * *